US008922291B2

(12) United States Patent
Xie et al.

(10) Patent No.: US 8,922,291 B2
(45) Date of Patent: Dec. 30, 2014

(54) DIFFERENTIAL TRANSMISSION LINE SHIELDED BY TWO OR MORE SPACED GROUPS OF SHIELDS

(75) Inventors: Haolu Xie, Chandler, AZ (US); Chi-Taou Tsai, Chandler, AZ (US); Patrick L. Rakers, Scottsdale, AZ (US)

(73) Assignee: Intel IP Corporation, Santa Clara, CA (US)

( * ) Notice: Subject to any disclaimer, the term of this patent is extended or adjusted under 35 U.S.C. 154(b) by 261 days.

(21) Appl. No.: 13/467,447

(22) Filed: May 9, 2012

(65) Prior Publication Data
US 2013/0300514 A1   Nov. 14, 2013

(51) Int. Cl.
*H05K 1/02*   (2006.01)
(52) U.S. Cl.
CPC ............ *H05K 1/0219* (2013.01); *H05K 1/0245* (2013.01)
USPC .............................................. 333/4; 333/238
(58) Field of Classification Search
CPC ....... H01P 3/08; H05K 1/0245; H05K 1/0219
USPC ................................................ 333/4, 5, 238
See application file for complete search history.

(56) References Cited

U.S. PATENT DOCUMENTS

| | | | | |
|---|---|---|---|---|
| 5,818,315 | A | * | 10/1998 | Moongilan ................... 333/238 |
| 6,624,729 | B2 | * | 9/2003 | Wright et al. ................ 333/238 |
| 7,852,176 | B2 | | 12/2010 | Chang et al. ................. 333/246 |
| 2009/0175378 | A1 | | 7/2009 | Staszewski et al. .......... 375/295 |
| 2010/0141354 | A1 | * | 6/2010 | Cho ............................. 333/160 |
| 2010/0225425 | A1 | * | 9/2010 | Cho ............................. 333/238 |

OTHER PUBLICATIONS

Cheung et al.; "Shielded Passive Devices for Silicon-Based Monolithic Microwave and Millimeter-wave Integrated Circuits" IEEE Journal of Solid-State Circuits, vol. 41, No. 5; pp. 18, May 2006.

* cited by examiner

*Primary Examiner* — Benny Lee
(74) *Attorney, Agent, or Firm* — Baker Botts L.L.P.

(57) ABSTRACT

A shield for differential transmission lines formed in a first metal layer may include one or more floating shields, each floating shield comprising an upper-side tile formed in a second metal layer of the integrated circuit adjacent to the first metal layer, a lower-side tile formed in a third metal layer of the integrated circuit adjacent to the first metal layer and non-adjacent to the second metal layer, and at least one via configured to electrically couple the upper-side tile at an end of the length of the upper-side tile to the lower-side tile and at an end of the length of the lower-side tile.

16 Claims, 5 Drawing Sheets

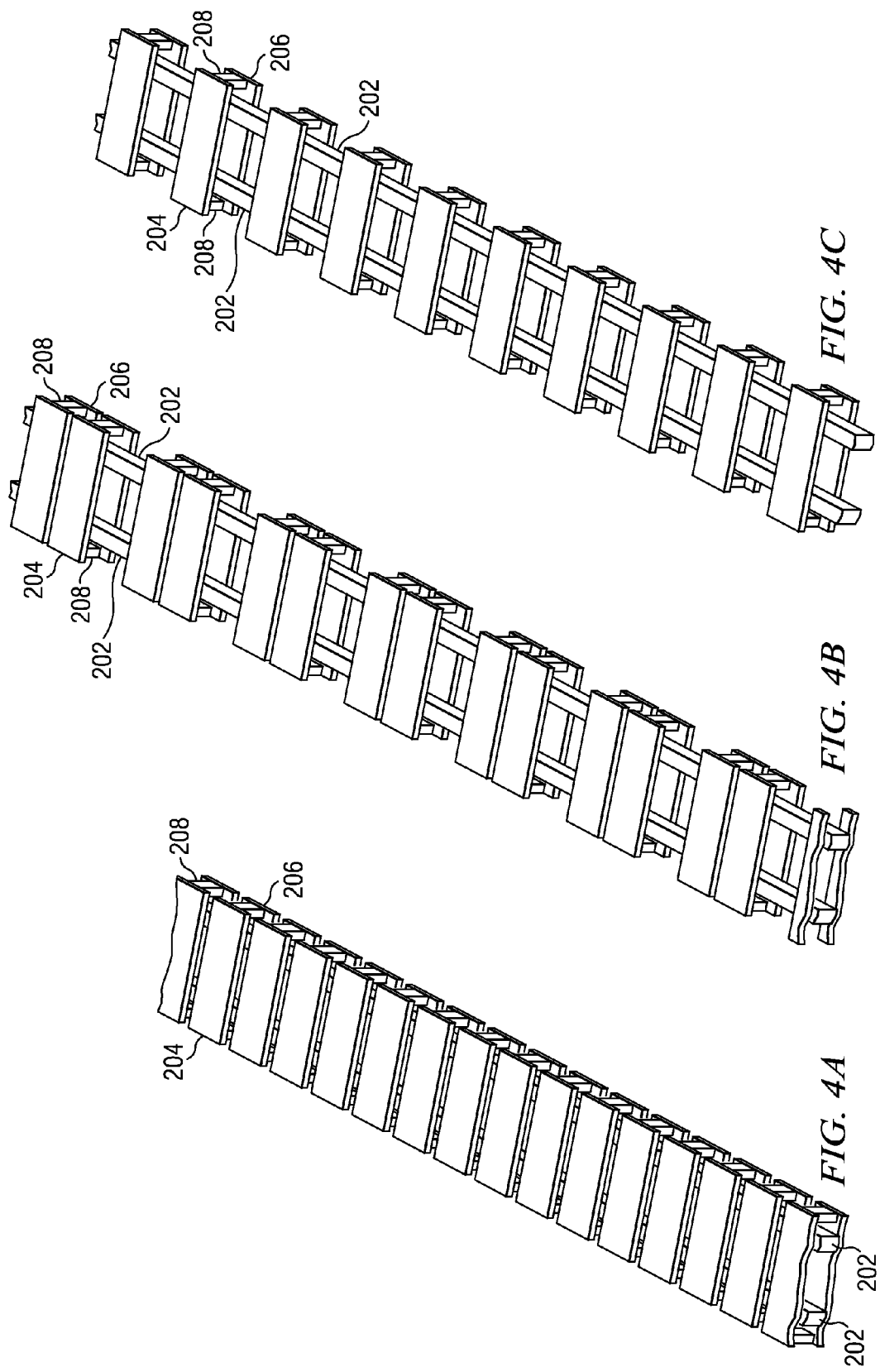

DIFFERENTIAL TRANSMISSION LINE SHIELDED BY TWO OR MORE SPACED GROUPS OF SHIELDS

TECHNICAL FIELD

The present disclosure relates generally to integrated circuits and, more particularly, to shielding transmission lines in an integrated circuit.

BACKGROUND

Integrated circuits are used in a variety of electronics applications, including communications systems, microprocessors, and other systems. Often, integrated circuits will include electrically conductive traces referred to as "transmission lines" that may carry synchronization signals (e.g., clock signals, oscillator signals, etc.) or other signals over long distances, in some cases throughout an entire integrated circuit. These transmission lines are often susceptible to noise from other adjacent circuitries and/or interconnects on the integrated circuit and/or off the integrated circuit. Such noise can lead to numerous undesirable effects, including signal demodulation, crosstalk, spurs, and/or other effects.

To reduce the incident of noise, integrated circuit designers often employ a technique known as electromagnetic shielding, or simply "shielding." Shielding is a process by which electromagnetic field in a space may be reduced by blocking the electromagnetic field with barriers made of conductive or magnetic materials. Thus, by shielding transmission lines, such transmission lines may be electromagnetic isolated from the environment through which the transmission lines run.

FIGS. 1A and 1B depict traditional approaches to shielding differential transmission lines in integrated circuits. As shown in FIG. 1A, one traditional approach to shielding transmission lines in an integrated circuit is to include one or more conductive traces 104 parallel to the transmission lines 102, typically formed in the same metal layer as the transmission lines, and often typically coupled to a high-electrical potential or low-electrical potential (e.g., a voltage source or ground voltage). As shown in FIG. 1B, another traditional approach includes forming one or more "planes" 106 of conductive material running parallel to the metal layer of the integrated circuit from which the transmission lines 102 are formed, wherein such planes are often typically coupled to a high-electrical potential or low-electrical potential (e.g., a voltage source or ground voltage). In some instances, the approaches depicted in FIGS. 1A and 1B are combined. However, such traditional approaches have disadvantages. For example, while the approach used in FIG. 1A often provides effective shielding for lateral sources of noise (e.g., in same plane as the differential transmission lines), other sources of noise are not effectively shielded. The approach in FIG. 1B provides more effective shielding (especially when coupled with the approach in FIG. 1A), but leads to a relatively high current drain in the differential transmission lines, thus leading to greater power consumption.

SUMMARY OF THE INVENTION

In accordance with embodiments of the present disclosure, a method may include forming a pair of differential transmission lines in a first layer of metal of an integrated circuit, the pair comprising a first transmission line and a second transmission line, the first transmission line configured to carry a first signal complementary to a second signal carried by the second transmission line, each of the first transmission line and the second transmission comprising a length and a width generally parallel to the first metal layer, wherein the length is greater than the width and current flowing in the first transmission line and second transmission line flows in a direction generally parallel to the length. The method may also include forming a plurality of shields, each shield comprising: an upper-side tile formed in a second metal layer of the integrated circuit adjacent to the first metal layer, the upper-side tile having a length measured in an axis parallel to the second metal layer and perpendicular to the length of the differential transmission lines and a width measured in an axis perpendicular to its length and parallel to the length of the differential transmission lines; a lower-side tile formed in a third metal layer of the integrated circuit adjacent to the first metal layer and non-adjacent to the second metal layer, the lower-side tile having a length measured in an axis parallel to the third metal layer and perpendicular to the length of the differential transmission lines and a width measured in an axis perpendicular to its length and parallel to the length of the differential transmission lines; and at least one via configured to electrically couple the upper-side tile at an end of the length of the upper-side tile to the lower-side tile and at an end of the length of the lower-side tile.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

For a more complete understanding of the present disclosure and its features and advantages, reference is now made to the following description, taken in conjunction with the accompanying drawings, in which:

FIGS. 4A-4C illustrate perspective views of pairs of differential transmission lines with varying density of associated shielding, in accordance with certain embodiments of the present disclosure.

DETAILED DESCRIPTION OF THE INVENTION

Figure 1A:
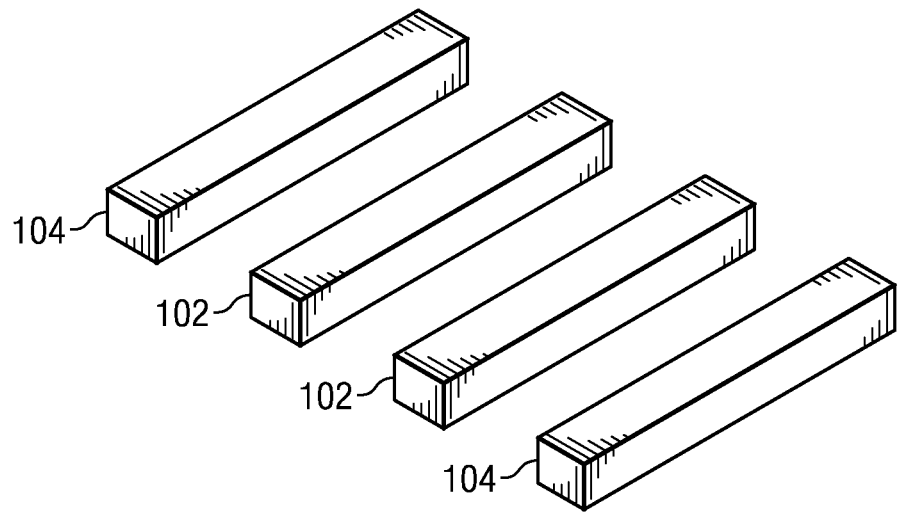
FIGS. 1A and 1B illustrate traditional approaches to electromagnetic shielding in an integrated circuit.
Figure 1B:
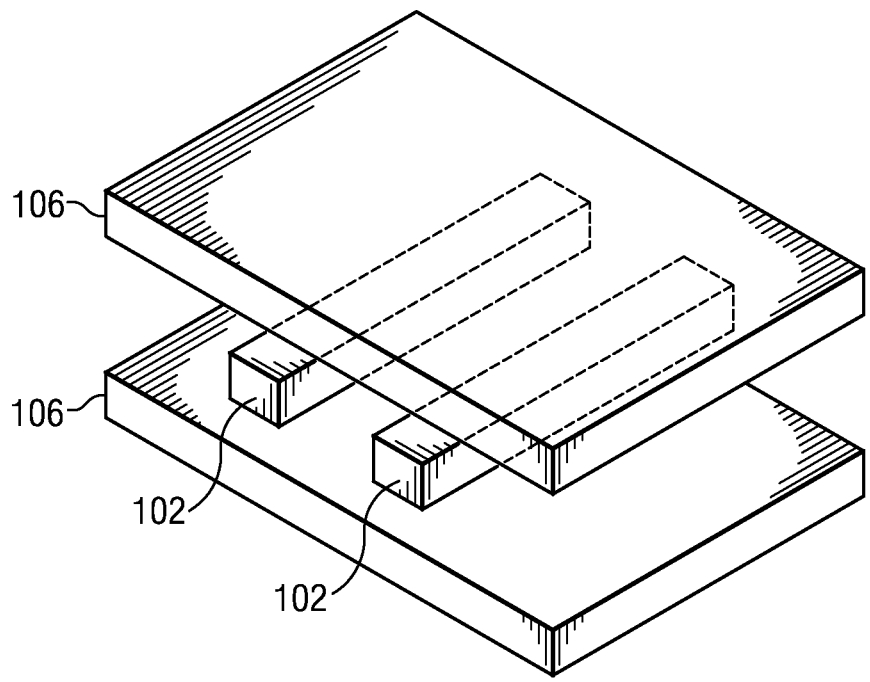
Figure 2A:
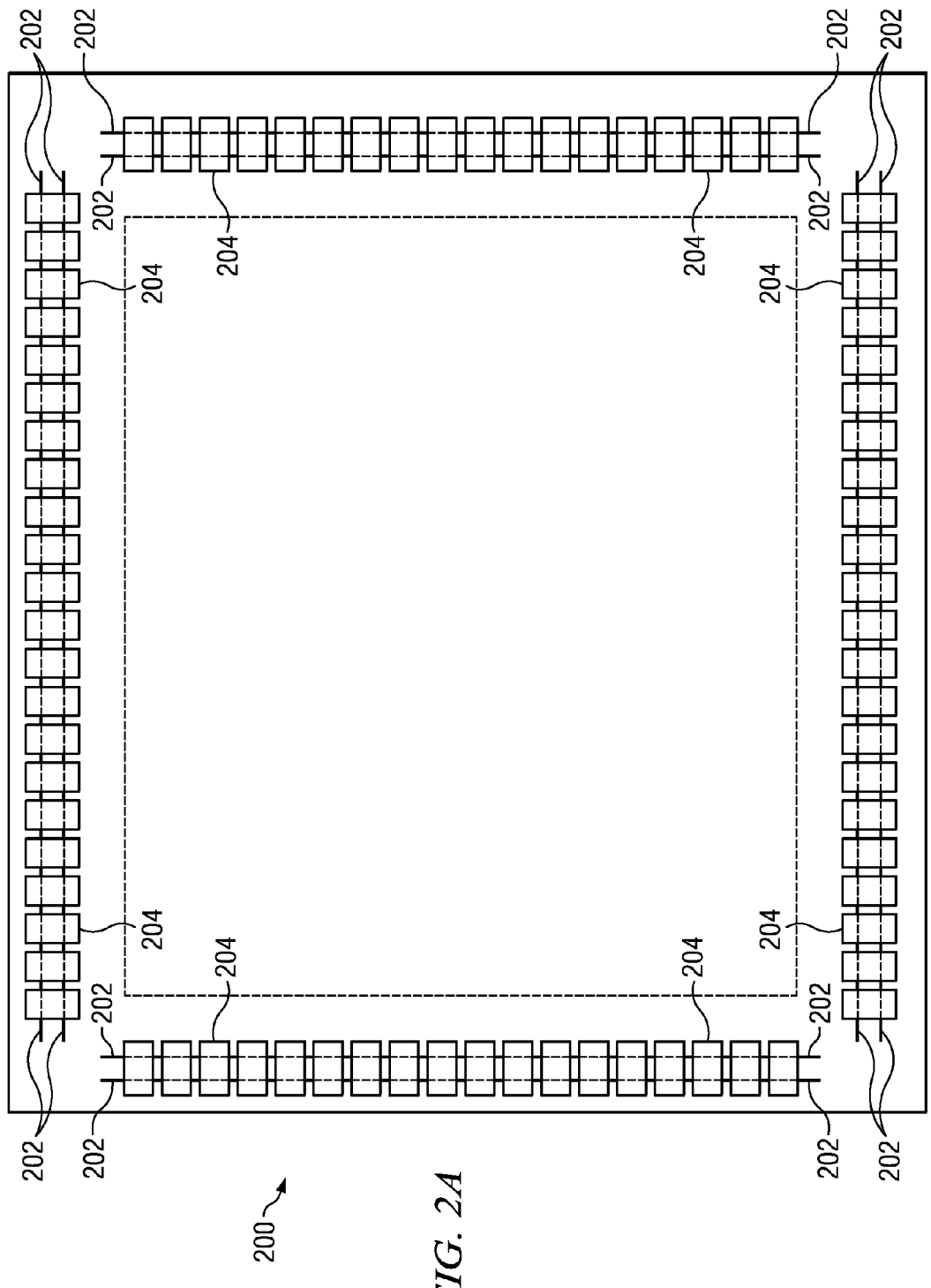
FIGS. 2A and 2B illustrates a plan view and cross-sectional elevation view, respectively, of selected components of an example integrated circuit, in accordance with certain embodiments of the present disclosure.
Figure 2B:
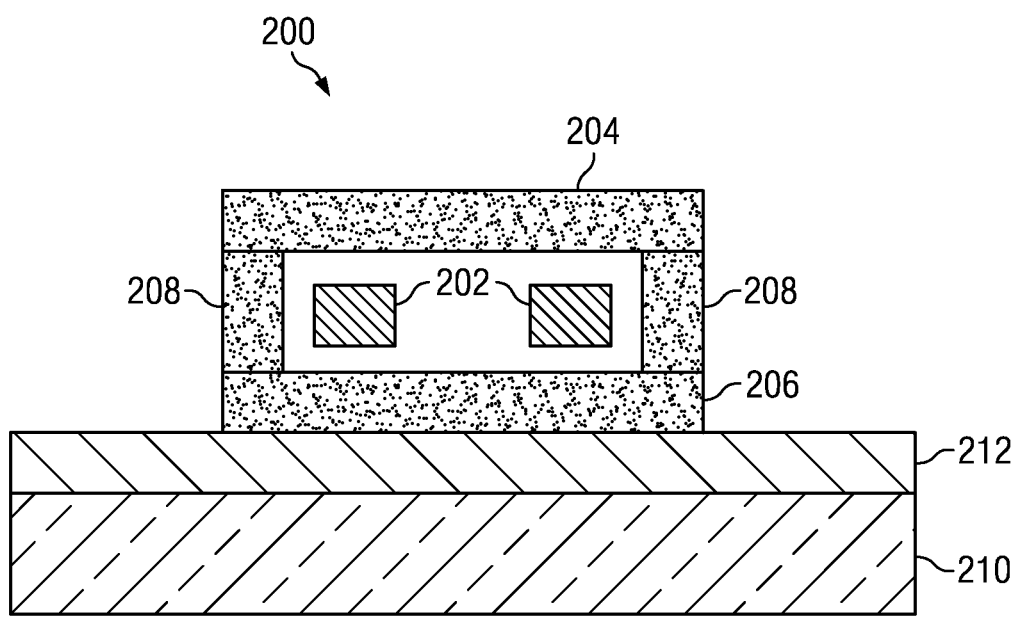
Figure 3:
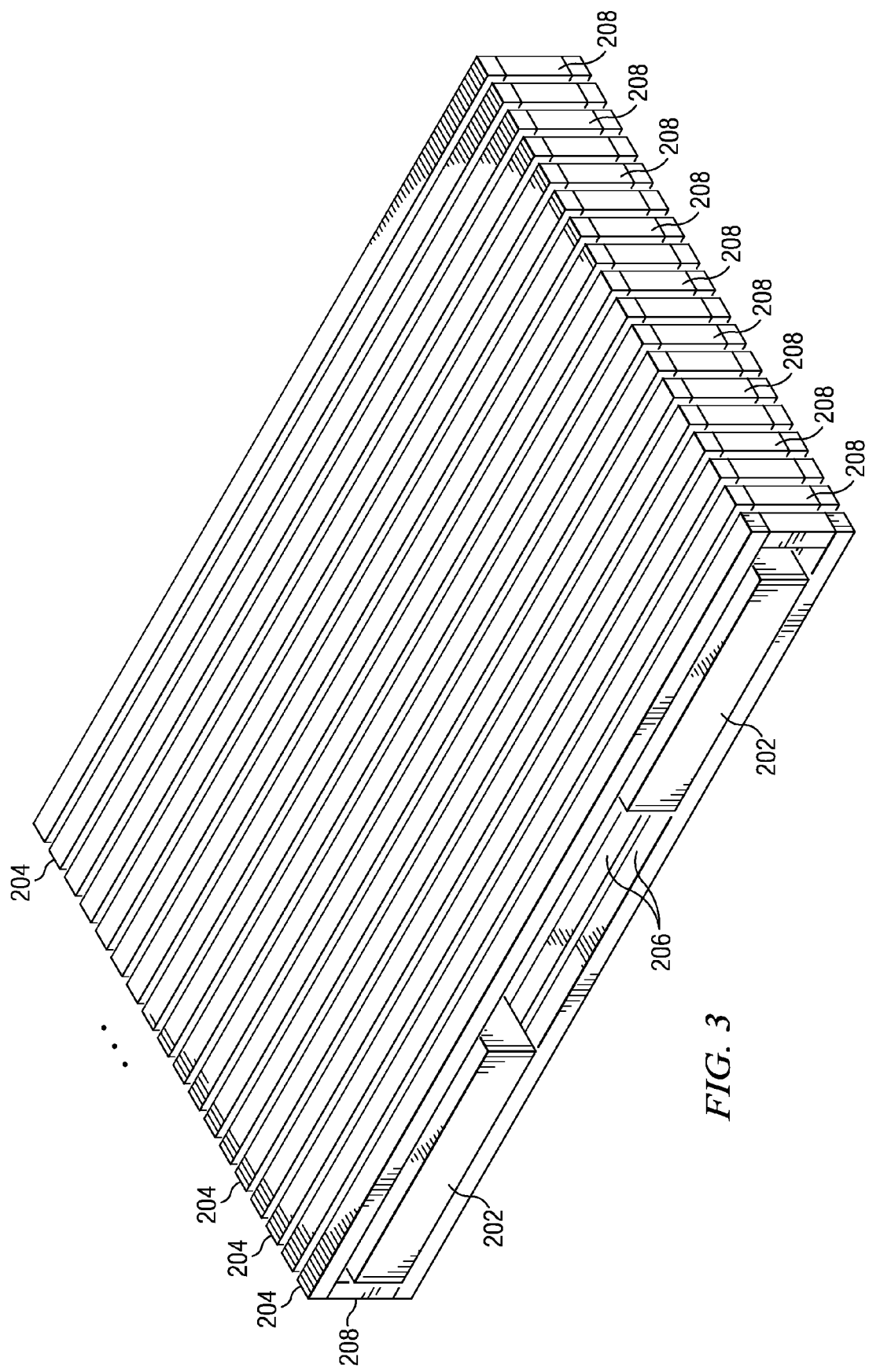
FIG. 3 illustrates a perspective view of a pair of differential transmission lines and associated shielding, in accordance with certain embodiments of the present disclosure.

FIGS. 2A and 2B illustrates a plan view and cross-sectional elevation view, respectively, of selected components of an example integrated circuit 200, in accordance with certain embodiments of the present disclosure. FIG. 3 illustrates a perspective view of a pair of differential transmission lines 202 and associated shielding, in accordance with certain embodiments of the present disclosure. As known in the art, an integrated circuit may be fabricated on a semiconductor substrate 210 as shown in FIG. 2B. During the fabrication process, an insulator layer 212 (FIG. 2B) comprising silicon dioxide or similar material may be formed over certain portion of semiconductor substrate 210 in order to provide insulation between conductive elements of integrated circuit 200 and substrate 210. Also as known in the art, one or more layers of metal parallel to the surface of substrate 210 may be formed and from such layers, fabrication techniques may be used to create desired geometries for metallization to form transmission lines, shields, and other conductive circuit traces.

As shown in FIGS. 2A, 2B, and 3, a pair of differential transmission lines 202 may be formed in a first metal layer of integrated circuit 200. Differential transmission lines 202 may comprise a differential pair configured to employ differential signaling, whereby each of differential transmission lines 202 carries a signal complementary to the other. Each transmission line 200 may have a length and a width generally parallel to the first metal layer from which it is formed, wherein the length is typically much larger than the width, such that current flowing in a transmission line 200 typically flows in a direction generally parallel to the length.

As depicted in FIGS. 2A, 2B, and 3, differential transmission lines 202 may be shielded by a plurality of upper-side tiles 204, lower-side tiles 206 (FIGS. 2B, 3), and vias 208 (FIGS. 2B, 3). Upper-side tiles 204 may be formed in a second metal layer of integrated circuit 200 adjacent to the first metal layer in which transmission lines 202 are formed. Each upper-side tile 204 may have a length measured in an axis parallel to the second metal layer and perpendicular to the length of its corresponding transmission lines 202. The length of each upper-side tile 204 may be sufficient to extend the width of both of its associated differential transmission lines 202 and the distance between such differential transmission lines. Each upper-side tile 204 may also have a width measured in an axis perpendicular to its length and parallel to the length of its corresponding transmission lines 202. The width of each upper-side tile 204 may be sized such that it is smaller than a wavelength of a signal to be carried in its corresponding transmission lines 202.

Lower-side tiles 206 may be formed in a third metal layer of integrated circuit 200 adjacent to the first metal layer in which transmission lines 202 are formed and not adjacent to the second metal layer in which upper-side tiles 204 are formed. Each lower-side tile 206 may have a length measured in an axis parallel to the third metal layer and perpendicular to the length of its corresponding transmission lines 202. The length of each lower-side tile 206 may be sufficient to extend the width of both of its associated differential transmission lines 202 and the distance between such differential transmission lines. Each lower-side tile 206 may also have a width measured in an axis perpendicular to its length and parallel to the length of its corresponding transmission lines 202. The width of each lower-side tile 206 may be sized such that it is smaller than a wavelength of a signal to be carried in its corresponding transmission lines 202.

At least one end of the length of each upper-side tile 204 may be coupled to the end of the length of a corresponding lower-side tile 206 by a via 208. A via 208 may be any trace of conductive material (e.g., metal) configured to be coupled between adjacent or non-adjacent metal layers in an integrated circuit. In the embodiment depicted in FIGS. 2A, 2B, and 3, both ends of the length of upper-side tile 204 are coupled to the ends of the length of a corresponding lower-side tile 206 by a vias 208. Thus, as depicted, differential transmission lines 202 may be shielded by a plurality of shields, each shield comprising an upper-side tile 204, a lower-side tile 206, and at least one via 208, such that particular portions of the differential transmission lines may be substantially enclosed by a shield.

Although transmission lines 202, upper-side tiles 204, lower-side tiles 206, and vias 208 are shown as particular metal layers in FIG. 2B (e.g., the first three metal layers above substrate 210), it is understood that transmission lines 202, upper-side tiles 204, lower-side tiles 206, and vias 208 may be formed in any suitable layers of integrated circuit 200.

In certain embodiments of the present disclosure, upper-side tiles 204, lower-side tiles 206, and vias 208 may be configured such that, during operation of integrated circuit 200, upper-side tiles 204, lower-side tiles 206, and vias 208 are electrically floating (e.g., not electrically coupled to any electric potential, whether it be a power source, ground, circuit signal, or other potential). In these and other embodiments, each shield comprising upper-side tiles 204, lower-side tiles 206, and vias 208 may be configured such that it is not electrically coupled to another shield.

Using shields as described above, the effective electrical length of transmission lines 202 (and thus, the capacitance, signal propagation delay, drain current, and power consumption) may be tuned based on the density of shielding to achieve desired electric properties for transmission lines 202, and design-trade offs may be made between electrical isolation of transmission lines 202 and such electrical properties. As particular examples, FIGS. 4A-4C illustrate perspective views of pairs of differential transmission lines 202 with varying density of associated shielding, including upper-side tiles 204, lower-side tiles 206, and vias 208, in accordance with certain embodiments of the present disclosure. FIG. 4A depicts substantially complete shielding density, FIG. 4B illustrates two-thirds shielding density, and FIG. 4C illustrates one-half shielding density. In each case, shielding geometry is applied with periodicity (e.g., individual shields or groups of shields are spaced approximately evenly apart over the length of differential transmission lines 202), such that the relevant shielding density is distributed over the length of differential transmission lines 202. For example, in FIG. 4B, individual groups of two shields are evenly spaced from each over the length of transmission lines 202 (e.g., spacing between successive groups are approximately equal to the width of an individual shield). As another example, in FIG. 4C, individual groups of one shield are evenly spaced from each over the length of transmission lines 202 (e.g., spacing between successive groups are approximately equal to the width of an individual shield). Although specific shielding geometries and periodicities are contemplated in FIGS. 4A-4C, it is understood that other shielding geometries and/or periodicities may be used to obtain desired electrical isolation and/or other electrical properties (e.g., effective transmission line length, capacitance, signal propagation delay, drain current, power consumption, etc.), such that shields along the length of differential transmission lines 202 comprise a plurality of groups of one or more shields, each group comprising a similar geometry of shields, and each group spaced from adjacent groups by an approximately equal distance along the length of the differential transmission lines.

Modifications, additions, or omissions may be made to integrated circuit 200 from the scope of the disclosure. The components of integrated circuit 200 may be integrated or separated. Moreover, the operations of integrated circuit 200 may be performed by more, fewer, or other components. As used in this document, "each" refers to each member of a set or each member of a subset of a set.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could me made hereto without departing from the spirit and scope of the invention.

What is claimed is:

1. An integrated circuit comprising:
    a pair of differential transmission lines formed in a first layer of metal of the integrated circuit, the pair comprising a first transmission line and a second transmission line, the first transmission line configured to carry a first signal complementary to a second signal carried by the second transmission line, each of the first transmission line and the second transmission comprising a length and a width generally parallel to the first metal layer, wherein the length is greater than the width and current flowing in the first transmission line and second transmission line flows in a direction generally parallel to the length; and
    a plurality of shields, each shield comprising:
        an upper-side tile formed in a second metal layer of the integrated circuit adjacent to the first metal layer, the upper-side tile having a length measured in an axis parallel to the second metal layer and perpendicular to the length of the differential transmission lines and a width measured in an axis perpendicular to the length thereof and parallel to the length of the differential transmission lines;
        a lower-side tile formed in a third metal layer of the integrated circuit adjacent to the first metal layer and non-adjacent to the second metal layer, the lower-side tile having a length measured in an axis parallel to the third metal layer and perpendicular to the length of the differential transmission lines and a width measured in an axis perpendicular to the length thereof and parallel to the length of the differential transmission lines; and
        at least one via configured to electrically couple the upper-side tile at an end of the length of the upper-side tile to the lower-side tile and at an end of the length of the lower-side tile;
    wherein the plurality of shields comprises a plurality of groups of two or more shields, each group comprising a similar geometry of two or more shields, and each group spaced from adjacent groups by an approximately equal distance along the length of the differential transmission lines, wherein the approximately equal distance between each group is greater than a spacing between the two or more shields within each group.

2. The integrated circuit of claim 1, wherein each shield is electrically floating.

3. The integrated circuit of claim 1, wherein each shield is not electrically coupled to any other shields of the plurality of shields.

4. The integrated circuit of claim 1, wherein each of the width of the upper-side tile and the width of the lower-side tile is shorter than a wavelength of a signal carried by the differential transmission lines.

5. The integrated circuit of claim 1, wherein at least one of the similar geometry of each group and the spacing between adjacent groups is configured to provide a desired shielding density for the differential transmission lines.

6. The integrated circuit of claim 5, wherein the desired shielding density is selected based on a desired electrical isolation of the differential transmission lines.

7. The integrated circuit of claim 5, wherein the desired shielding density is selected based on a desired electrical property of the differential transmission lines.

8. The integrated circuit of claim 7, the desired electrical property comprising one of an effective transmission length of the differential transmission lines, a capacitance of the differential transmission lines, a signal propagation delay of the differential transmission lines, a drain current associated with the differential transmission lines, and a power consumption associated with the differential transmission lines.

9. A method comprising:
    forming a pair of differential transmission lines in a first layer of metal of an integrated circuit, the pair comprising a first transmission line and a second transmission line, the first transmission line configured to carry a first signal complementary to a second signal carried by the second transmission line, each of the first transmission line and the second transmission comprising a length and a width generally parallel to the first metal layer, wherein the length is greater than the width and current flowing in the first transmission line and second transmission line flows in a direction generally parallel to the length; and
    forming a plurality of shields, each shield comprising:
        an upper-side tile formed in a second metal layer of the integrated circuit adjacent to the first metal layer, the upper-side tile having a length measured in an axis parallel to the second metal layer and perpendicular to the length of the differential transmission lines and a width measured in an axis perpendicular to the length thereof and parallel to the length of the differential transmission lines;
        a lower-side tile formed in a third metal layer of the integrated circuit adjacent to the first metal layer and non-adjacent to the second metal layer, the lower-side tile having a length measured in an axis parallel to the third metal layer and perpendicular to the length of the differential transmission lines and a width measured in an axis perpendicular to the length thereof and parallel to the length of the differential transmission lines; and
        at least one via configured to electrically couple the upper-side tile at an end of the length of the upper-side tile to the lower-side tile and at an end of the length of the lower-side tile;
    wherein the plurality of shields comprises a plurality of groups of two or more shields, each group comprising a similar geometry of two or more shields, and each group spaced from adjacent groups by an approximately equal distance along the length of the differential transmission lines, wherein the approximately equal distance between each group is greater than a spacing between the two or more shields within each group.

10. The method of claim 9, wherein each of the width of the upper-side tile and the width of the lower-side tile is shorter than a wavelength of a signal carried by the differential transmission lines.

11. The method of claim 9, further comprising forming the each shield such that each shield is electrically floating.

12. The method of claim 9, further comprising forming each shield such that each shield is not electrically coupled to any other shields of the plurality of shields.

13. The method of claim 9, wherein at least one of the similar geometry of each group and the spacing between adjacent groups is configured to provide a desired shielding density for the differential transmission lines.

14. The method of claim 13, further comprising selecting the desired shielding density based on a desired electrical property of the differential transmission lines.

15. The method of claim 14, the desired electrical property comprising one of an effective transmission length of the differential transmission lines, a capacitance of the differential transmission lines, a signal propagation delay of the differential transmission lines, a drain current associated with the differential transmission lines, and a power consumption associated with the differential transmission lines.

16. The method of claim 13, further comprising selecting the desired shielding density based on a desired electrical isolation of the differential transmission lines.

* * * * *